United States Patent
Yen

(10) Patent No.: US 8,823,430 B2
(45) Date of Patent: Sep. 2, 2014

(54) CLOCK GENERATING CIRCUIT AND CLOCK GENERATING METHOD

(75) Inventor: Shih-Chieh Yen, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 57 days.

(21) Appl. No.: 13/108,191

(22) Filed: May 16, 2011

(65) Prior Publication Data

US 2011/0279154 A1 Nov. 17, 2011

(30) Foreign Application Priority Data

May 17, 2010 (TW) ................................ 99115680 A

(51) Int. Cl.
*H03L 7/06* (2006.01)
(52) U.S. Cl.
USPC .......................................... 327/156; 327/147
(58) Field of Classification Search
CPC .......... H03L 7/0891; H03L 7/18; H03L 7/093
USPC ................................................. 327/147, 156
See application file for complete search history.

(56) References Cited

U.S. PATENT DOCUMENTS

| | | | | |
|---|---|---|---|---|
| 5,072,298 A * | 12/1991 | Sumiyoshi | ..................... | 348/711 |
| 6,389,092 B1 * | 5/2002 | Momtaz | ........................ | 375/376 |
| 6,480,035 B1 * | 11/2002 | Donnelly et al. | ................. | 327/3 |
| 6,748,041 B1 * | 6/2004 | Gutierrez et al. | ............. | 375/376 |
| 6,993,106 B1 * | 1/2006 | Momtaz | ........................ | 375/376 |
| 7,126,430 B2 * | 10/2006 | Oba et al. | ........................ | 331/11 |
| 7,266,171 B2 * | 9/2007 | Yamawaki et al. | ........... | 375/376 |
| 7,595,671 B2 * | 9/2009 | Watanabe | ..................... | 327/156 |
| 7,619,454 B2 * | 11/2009 | Lee | ................. | 327/161 |
| 7,825,706 B2 * | 11/2010 | Smith et al. | ................... | 327/156 |
| 2006/0170468 A1 * | 8/2006 | Takahashi | ..................... | 327/156 |
| 2006/0197562 A1 * | 9/2006 | Smith et al. | ................... | 327/156 |
| 2006/0220711 A1 * | 10/2006 | Sanduleanu et al. | ......... | 327/157 |
| 2007/0103214 A1 * | 5/2007 | Drexler et al. | ................ | 327/156 |
| 2009/0206892 A1 * | 8/2009 | Li | .................................. | 327/156 |
| 2011/0204940 A1 * | 8/2011 | Kanda | ........................... | 327/157 |
| 2011/0279154 A1 * | 11/2011 | Yen | ................................. | 327/148 |
| 2012/0007641 A1 * | 1/2012 | Fujii et al. | ..................... | 327/156 |
| 2012/0154000 A1 * | 6/2012 | Tabata | ........................... | 327/157 |

\* cited by examiner

*Primary Examiner* — Adam Houston
(74) *Attorney, Agent, or Firm* — Edell, Shapiro & Finnan, LLC

(57) ABSTRACT

A clock generating circuit includes a phase detector for detecting a phase difference between a first clock and a second clock to generate a detecting result associated with the phase difference, a first filtering device for filtering the detecting result, a charge pump for generating a control signal according to the filtered detecting result, a second filtering device for filtering the control signal, and a controllable oscillator for generating an output clock according to the filtered control signal, wherein the output clock is utilized to generate the second clock.

6 Claims, 8 Drawing Sheets

CLOCK GENERATING CIRCUIT AND CLOCK GENERATING METHOD

CROSS REFERENCE TO RELATED PATENT APPLICATION

This patent application is based on Taiwan, R.O.C. patent application No. 099115680 filed on May 17, 2010.

FIELD OF THE INVENTION

The present disclosure relates to a clock generating circuit and the method thereof, and more particularly to a phase-locked loop circuit for alleviating ripple signals.

BACKGROUND OF THE INVENTION

FIG. 1A shows a schematic diagram of a traditional phase-locked loop circuit, and FIG. 1B shows a timing diagram of signals in the phase-locked loop circuit. The phase-locked loop circuit 10 comprises a phase/frequency detector 12, a charge pump 14, a low pass filter 16 and a voltage-controlled oscillator 18. Generally, the phase-locked loop 10 utilizes the phase/frequency detector 12 to detect a phase difference between a reference clock S1' and a feedback clock S2', and then utilizes the charge pump 14 to receive a first phase signal Sd1' and a second phase signal Sd2' to generate a current signal Sa' corresponding to the phase difference, wherein the phase signals Sd1' and Sd2' are represented in a pulse wave format. When the reference clock S1' leads the feedback clock S2', the first phase signal Sd1' of the phase/frequency detector 12 is at a high voltage level and the second phase signal Sd2' of the phase/frequency detector 12 is at a low voltage level. In contrast, when the feedback clock S2' leads the reference clock S1', the first phase signal Sd1' is at the low voltage level and the second phase signal Sd2' is at the high voltage. However, due to the nature of the response time in the charge pump 14 when converting the phase signals Sd1' and Sd2' to the current signal Sa', the charge pump 14 may not faithfully generate the current signal Sa' to have a pulse wave format. Thus, the traditional charge pump 14 usually comprises a current adjusting circuit for adjusting the current signal Sa' generated by the charge pump 14, so that the current signal Sa' can have a similar format compared to the phase signals Sd1' and Sd2'. When the current signal Sa' has a pulse wave format, it means that the current signal Sa' has high frequency components. Therefore, the low pass filter 16 coupled to the output of the charge pump 14 needs to have the ability of filtering out the high frequency components of the current signal Sa' to generate a control signal Scon' with low frequency to the voltage-controlled oscillator 18. In other words, the low pass filter 16 must be a multi-pole filter, which generally occupies a large circuit area and is more difficult to set.

As mentioned above, the current adjusting circuit not only adds circuit area to the phase-locked loop circuit 10 but also adds the design difficulty of the low pass filter 16. Furthermore, there is no obvious advantage to adjust the current signal Sa' generated by the charge pump 14 to have a pulse wave format, and indeed such a format may cause the control signal Scon' of the voltage-controlled oscillator 18 to include ripple signals (indicated by arrows in FIG. 2 at time points t1, t2 . . . t4).

SUMMARY OF THE INVENTION

Therefore, the present invention provides a phase-locked loop circuit and method thereof for alleviating ripple signals.

According to an embodiment of the present invention a clock generating circuit is provided. The clock generating circuit comprises a phase detector, a first filtering device, a charge pump, a second filtering device, and a controllable oscillator. The phase detector is used for detecting a phase difference between a first clock and a second clock to generate a detection result associated with the phase difference. The first filtering device is used for filtering the detection result. The charge pump is used for generating a control signal according to the detection result. The second filtering device is used for filtering the control signal. The controllable oscillator is used for generating an output clock according to the filtered control signal, wherein the output clock is used for generating the second clock.

According to another embodiment of the present invention a clock generating circuit is provided. The clock generating circuit comprises a phase detector, a charge pump, a second filtering device and a controllable oscillator. The phase detector is used for detecting a phase difference between a first clock and a second clock to generate a detection result associated with the phase difference. The charge pump is used for generating a control signal according to the detection result. The charge pump comprises a first filtering device used for filtering an intermediary signal between the detection result and the control signal. The second filtering device is used for filtering the control signal. The controllable oscillator is used for generating an output clock according to the filtered control signal, wherein the output clock is used to generate the second clock.

According to another embodiment of the present invention a clock generating method is provided. The clock generating method comprises: detecting a phase difference between a first clock and a second clock to generate a detection result associated with the phase difference; filtering the detection result; generating a control signal by a charge pump according to the filtered detection result; filtering the control signal; and generating an output clock according to the control signal, wherein the output clock is used for generating the second clock.

According to another embodiment of the present invention a clock generating method is provided. The clock generating method comprises: detecting a phase difference between a first clock and a second clock to generate a detection result associated with the phase difference; generating a control signal by using a charge pump according to the detection result and filtering an intermediary signal between the detection result and the control signal; filtering the control signal; and generating an output clock according to the filtered control signal, wherein the output clock is used for generating the second clock.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 2A:
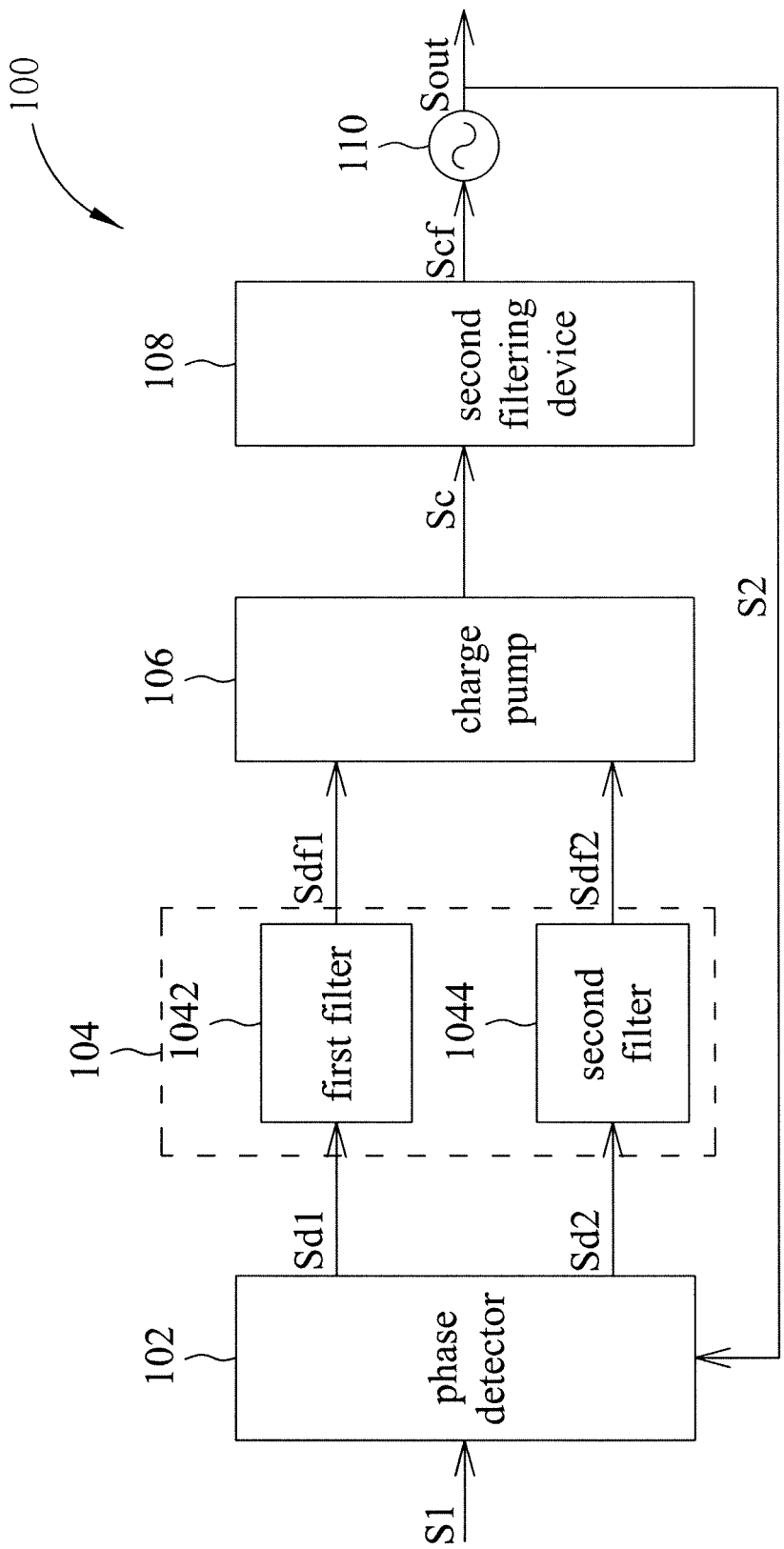
FIG. 2A depicts a diagram of a clock generating circuit according to an embodiment of the present invention.

FIG. 2A depicts a diagram of a clock generating circuit 100 according to an embodiment of the present invention. The clock generating circuit 100 comprises a phase detector 102, a first filtering device 104, a charge pump 106, a second filtering device 108 and a controllable oscillator 110. The phase detector 102 is used for detecting a phase difference between a first clock S1 and a second clock S2 to generate a detection result. The first filtering device 104 coupled to the phase detector 102 filters the detection result. The charge pump 106 coupled to the first filtering device 104 generates a control signal Sc according to the filtered detection result output by the first filtering device 104. The second filtering device 108 coupled to the charge pump 106 filters the control signal Sc to generate a filtered control signal Scf. The controllable oscillator 110 coupled to the second filtering device 108 and the phase detector 102 generates an output clock Sout according to the filtered control signal Scf, where the output clock Sout is used for generating the second clock S2. In the present embodiment, the output clock Sout is fed back directly to the phase detector 102 as the second clock S2. In another embodiment, the output clock Sout may also be fed back to the phase detector 102 as the second clock S2 after being frequency divided by using a frequency divider, and such an embodiment should also be considered to be within the scope of the present invention. On the other hand, while the clock generating circuit 100 is realized by using a phase-locked loop circuit in the present embodiment, it is to be understood that the disclosure needs not to be limited to the above embodiments. It is intended to cover various modifications and similar arrangement included within the spirit and scope of the appended claims which are to be accorded with the broadest interpretation so as to encompass all such modifications and similar structures. After reading the disclosed contents and techniques of the present disclosure, the person having ordinary skill in the art may adequately apply the spirit of the present disclosure to a data clock recovery circuit to acquire similar results.

For distinguishing the lead-lag relationship between the first clock S1 and the second clock S2, the detection result generated by the phase detector 102 thus comprises a first phase signal Sd1 and a second phase signal Sd2, wherein the first phase signal Sd1 represents the phase of the first clock S1 leading the second clock S2, and the second phase signal Sd2 represents the phase of the first clock S1 lagging the second clock S2. Further more, the first filtering device 104 comprises a first filter 1042 and a second filer 1044. The first filter 1042 receives the first phase signal Sd1 and filters the first phase signal Sd1 to generate a filtered first phase signal Sdf1. The second filter 1044 receives the second phase signal Sd2 and filters the second phase signal Sd2 to generate a filtered second phase signal Sdf2. The charge pump 106 generates the control signal Sc according to the filtered first phase signal Sdf1 and the filtered second phase signal Sdf2. In the present embodiment, the control signal Sc is a current signal.

Figure 2B:
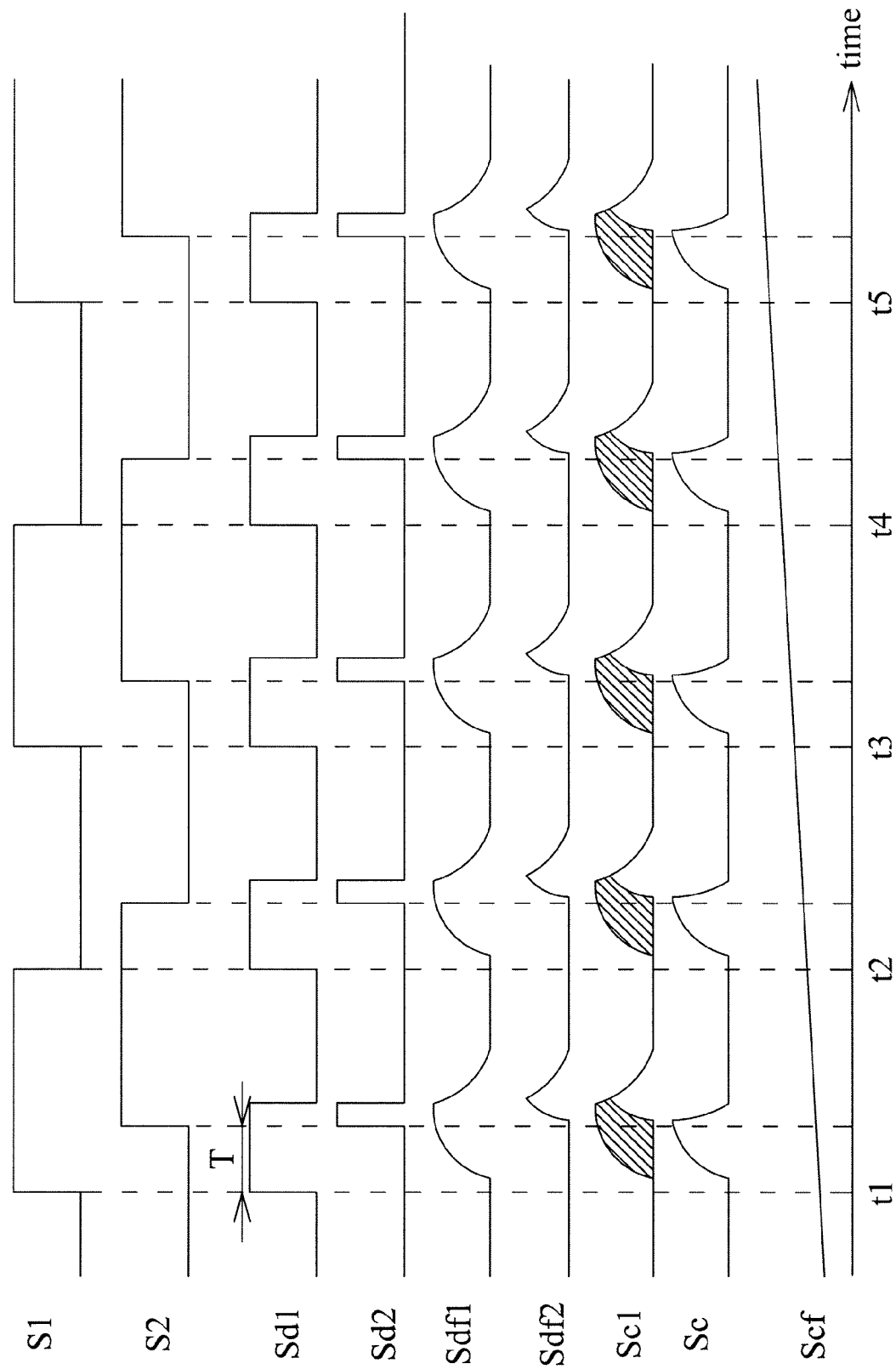
FIG. 2B depicts a timing diagram of signals in the phase-locked loop circuit in FIG. 2A.

Generally speaking, when the clock generating circuit 100 is in phase locking operation, the lead-lag relationship between the first clock S1 and the second clock S2 is purely the case of first clock S1 leading the second clock S2 or the first clock S1 lagging the second clock S2, and due to the similarities in operation between the two cases, the present disclosure will solely describe the case of the first clock S1 leading the second clock S2 to explain the characteristics of the clock generating circuit 100. The person having ordinary skill in the art shall understand that the clock generating circuit 10 has similar characteristics when the first clock S1 lags the second clock. Referring to FIG. 2B, FIG. 2B shows the timing diagram of the first clock S1, the second clock S2, the first phase signal Sd1, the second phase signal Sd2, the filtered first phase signal Sdf1, the filtered second phase signal Sdf2 and the filtered control signal Scf of the present disclosure. Since the first clock S1 leads the second clock S2, the phase detector 102 generates a first phase signal Sd1 to the first filter 1042 for the filtering process. Please note that, although FIGS. 2A and 2B in the present disclosure both draw the first phase signal Sd1, it is not necessary to have such first phase signal Sd1 with pulse wave format in the actual circuit. The first phase signal Sd1 with pulse wave format is provided here as an aid for illustrating the characteristics of the present disclosure. In another embodiment of the present disclosure, the phase detector 102 can be directly coupled to the charge pump 106, and the first filter 1042 can be coupled to a connection end of the phase detector 102 and the charge pump 106 for filtering the signals on the connection end. By doing so, the first phase signal Sd1 may have a similar waveform as that of the filtered first phase signal Sdf1. Similarly, the second filter 1044 is also suitable for characteristics of the technology mentioned above.

After the filtering process of the first filter 1042, the pulse shape of the first phase signal Sd1 generated by the phase detector 102 becomes the pulse shape of the filtered first phase signal Sdf1. As shown in FIG. 2B, pulses of the filtered first phase signal Sdf1 rise and fall slowly instead of rising and falling in an abrupt fashion as the pulses of the traditional phase-locked loop circuit. Then the charge pump 106 generates a first current I1 according to the filtered first phase signal Sdf1. Similarly, the pulse shapes of the first current I1 are rising and falling in a gentle fashion. It is noted that, under certain circumstances, such as where the circuit is non-ideal and has delay, the pulse width of the first phase signal Sd1 may be wider than the phase difference between the first clock S1 and the second clock S2, where the extended portion may generate a corresponding second phase signal Sd2 so the resulting second current I2 is not zero current, but instead, has a current value less than the first current I1. In other words, under the above case, the phase detector 102 may also generate the second phase signal Sd2, and therefore the filtered second phase signal Sdf2 may also have a corresponding voltage variation as shown in FIG. 2B. After the filtered first phase signal Sdf1 and the filtered second phase signal Sdf2 through the voltage to current conversion process, the charge pump 106 outputs the control signal Sc. In addition, the time duration T in each period of the first phase signal Sd1 represents the phase difference between the first clock S1 and the second clock S2. Furthermore, the non-overlapping portion between the filtered first phase signal Sdf1 and the filtered second phase signal Sdf2 (i.e. the hatched region in each period of the signal Sc1 in FIG. 2B). The area of the hatched region in each period of the signal Sc1 corresponds to the total current generated by the charge pump 106 in that period.

Figure 1A:
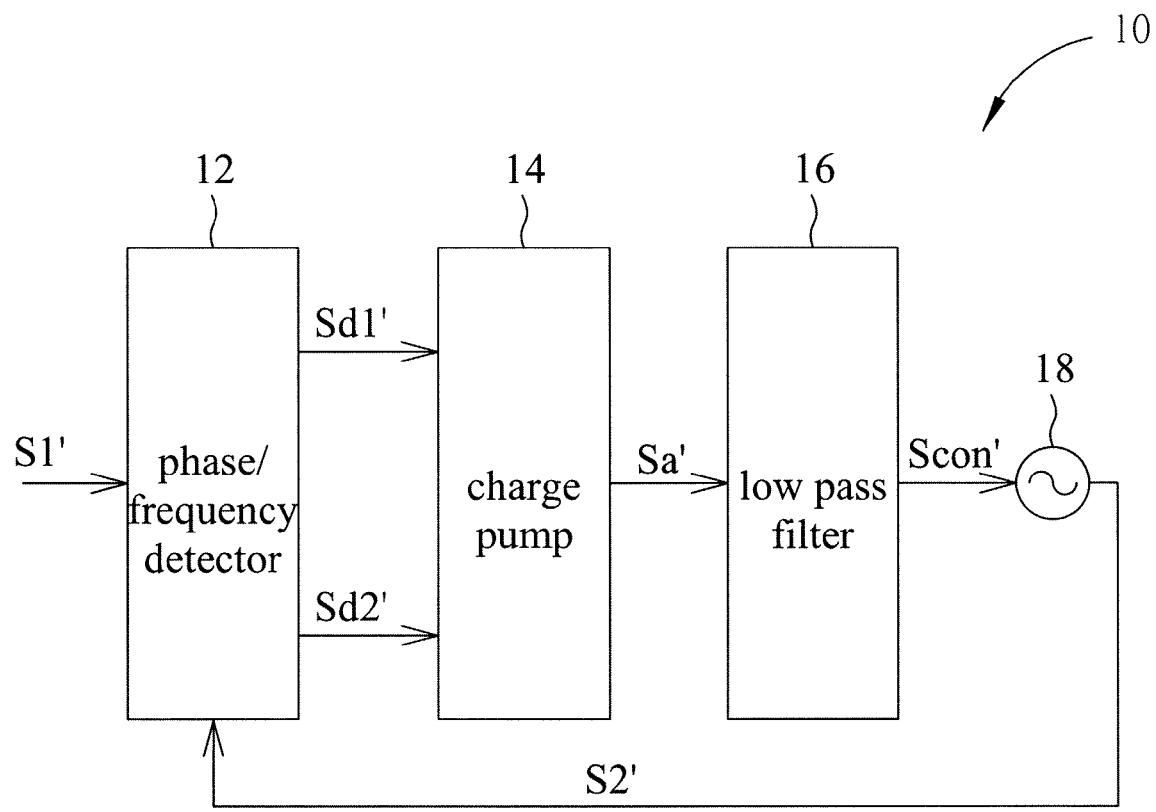
FIG. 1A depicts a diagram of a traditional phase-locked loop circuit.
Figure 1B:
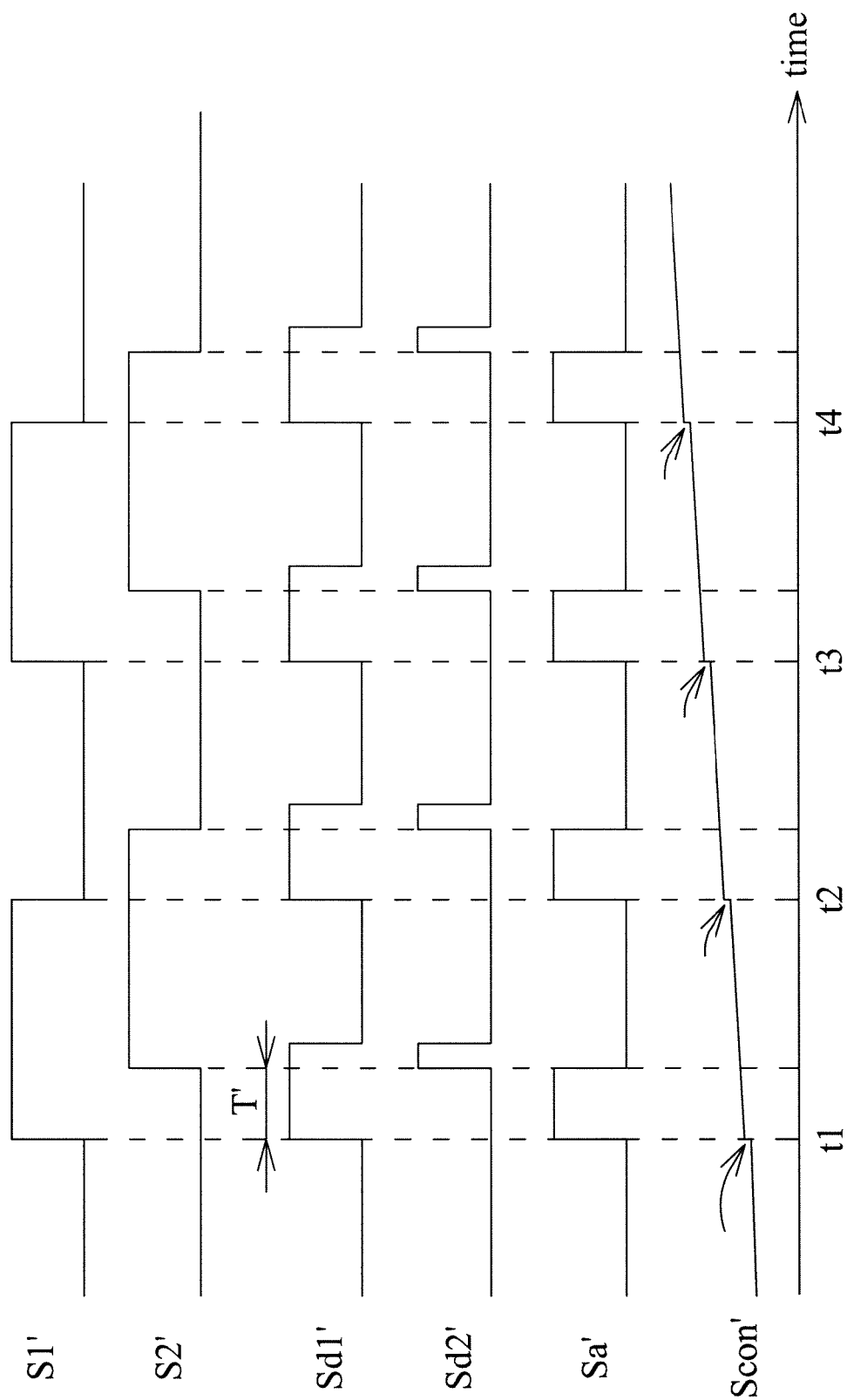
FIG. 1B depicts a timing diagram of signals in the phase-locked loop circuit in FIG. 1A.

Please further note that the total current is generally equivalent to the total current generated by the charge pump of the traditional phase-locked loop circuit (i.e. the phase-locked loop circuit without the first filtering device 104) in every period, and the signal Sc1 in FIG. 2B is merely used to indicate the total current of the control signal Sc output by the charge pump 106. In fact, the charge pump 106 only outputs the control signal Sc. The area of the pulse shape of the control signal (i.e. the control signal Sa' in FIG. 1A) generated by the charge pump of the traditional phase-locked loop circuit is generally equivalent to the area of the hatched region of the signal Sc1. Thus, in comparison with the traditional phase-locked loop circuit, the first filter 1042 of the present embodiment is disposed between the phase detector 102 and the charge pump 106 to extend the settling time of the first current I1 generated by the charge pump 106, while the total current generated by charge pump in the traditional phase-locked loop circuit in every period remains generally the same.

Subsequently, the second filtering device 108 low-pass filters the control signal Sc to generate a filtered control signal Scf. In contrast to the traditional phase-locked loop circuit, the control signal Sc in the present embodiment has lower frequency and thus the design specification of the second filter device 108 can be less strict, and thus it can also reduce the design complexity of the second filtering device 108 so as to reduce the product cost of the clock generating circuit 100. For example, the number of poles of the second filter device 108 can be less than the ones of the traditional loop filter. Moreover, since the frequency of the control signal Sc of the clock generating circuit 100 in the present embodiment is lower, the filtered control signal Scf generated by the second filtering device 108 may tend more toward a straight line, without ripples appearing in each period of the control signal Scon' of the traditional phase-locked loop circuit. Accordingly, the spurs of the output clock Sout generated by the controllable oscillator 110 can be greatly improved. Furthermore, in a traditional phase-locked loop circuit, the ripples are transmitted to the power source of other circuits through a power line thereby affecting the operations of those circuits. However, since the ripples of the filtered control signal Scf in the present disclosure have already been significantly removed, that problem becomes less relevant. On the other hand, from the description of the characteristics of the previously disclosed technology, it is not required to generate a control signal Sc having a pulse wave format in the present embodiment, and thus there is no need to design a high-speed charge pump 106 to generate the control signal Sc. This can further reduce the cost of the clock generating circuit 100.

Figure 3:
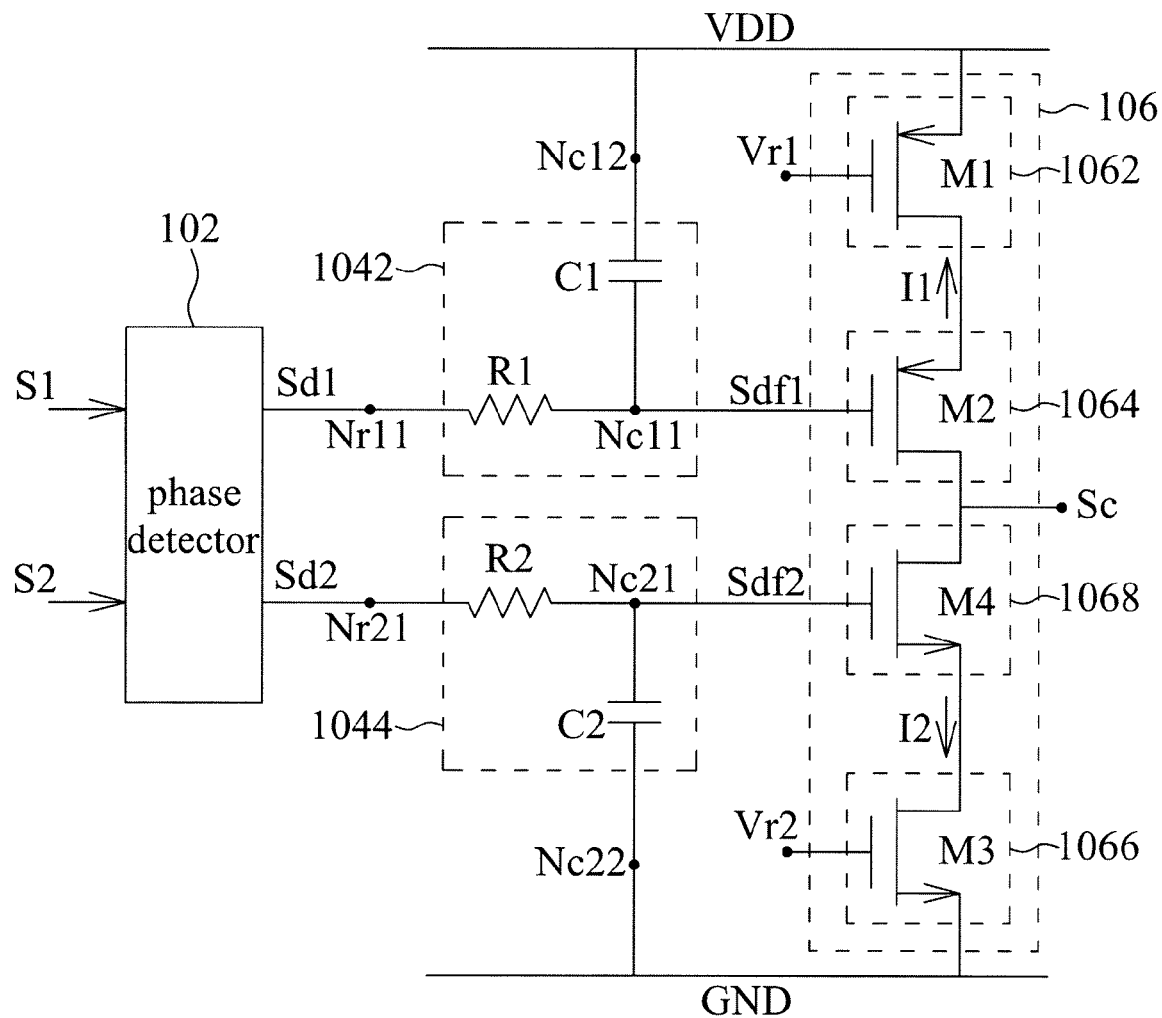
FIG. 3 depicts a circuit diagram of a phase detector, a first filtering device and a charge pump of the clock generating circuit according to an embodiment of the present invention.

FIG. 3 depicts circuitry details of the phase detector 102, the first filtering device 104 and the charge pump 106 of the clock generating circuit 100 according to an embodiment of the present invention. The charge pump 106 comprises a first current source 1062, a first switch 1064, a second current source 1066 and a second switch 1068. The first current source 1062 comprises a P-type field-effect transistor M1 having a source coupled to a first supply voltage VDD, and a gate for receiving a first reference voltage Vr1. The first switch 1064 comprises a P-type field-effect transistor M2 having a source coupled to a drain of the P-type field-effect transistor M1, and a gate coupled to a first filter 1042 of the first filtering device 104. The second current source 1066 comprises a N-type field-effect transistor M3 having a source coupled to a second supply voltage GND, the ground node, and a gate for receiving a second reference voltage Vr2. The second switch 1068 comprises a N-type field-effect transistor M4 having a source coupled to a drain of the N-type field-effect transistor M3, a gate coupled to the second filter 1044 of the first filtering device 104, and a drain coupled to a drain of the P-type field-effect transistor M2 to form the output end of the charge pump 106 for outputting the control signal Sc. The first filter 1042 comprises a capacitive component C1 and a resistive component R1. The capacitive component C1 has a first end Nc11 coupled to the gate of P-type field-effect transistor M2, and a second end Nc12 coupled to the first supply voltage VDD. The resistive component R1 has a first end coupled to the gate of the P-type field-effect transistor M2, and a second end Nr11 coupled to the phase detector 102 for receiving the first phase signal Sd1. Please note that, the first end Nc11 of the capacitive component C1 is used for outputting the filtered first phase signal Sdf1. In addition, the second filter 1044 comprises a capacitive component C2 and a resistive component R2. A first end Nc21 of the capacitive component C2 is coupled to the gate of the N-type field-effect transistor M4, and a second end Nc22 of the capacitive component C2 is coupled to the second supply voltage GND. A first end of the resistive component R2 is coupled to the gate of the N-type field-effect transistor M4, and a second end Nr21 of the resistive component R2 is coupled to the phase detector 102 for receiving the second phase signal Sd2. It is noted that the first end Nc21 of the capacitive component C2 is used for outputting the second filtered phase signal Sdf2.

When the phase detector 102 outputs the first phase signal Sd1, the low-pass filter composed of the capacitive component C1 and resistive component R1 filters the first phase signal Sd1 to generate the filtered first phase signal Sdf1 at the first end Nc11 of the capacitive component C1. After that, the P-type field-effect transistor M2 outputs the control signal Sc as shown in FIG. 2B by the control of the first filtered phase signal Sdf1. It is noted that the second filter 1044 filters the second phase signal Sd2 when the phase detector 102 outputs the second phase signal Sd2. It is assumed that the person having ordinary skill in the art can understand the operation of the second filter 1044 after reading the descriptions above, and thus the related contents will not be further detailed here.

On the other hand, the fact that the first filter 1042 and the second filter 1044 illustrated in FIG. 3 are both realized using RC filter are not to be construed as limiting the present disclosure. In another embodiment, the first filter 1042 and the second filter 1044 can also be realized by utilizing only a capacitive component. In other words, in the embodiment, the gates of the P-type field-effect transistor M2 and the N-type field-effect transistor M4 are directly coupled to the phase detector 102.

Figure 4:
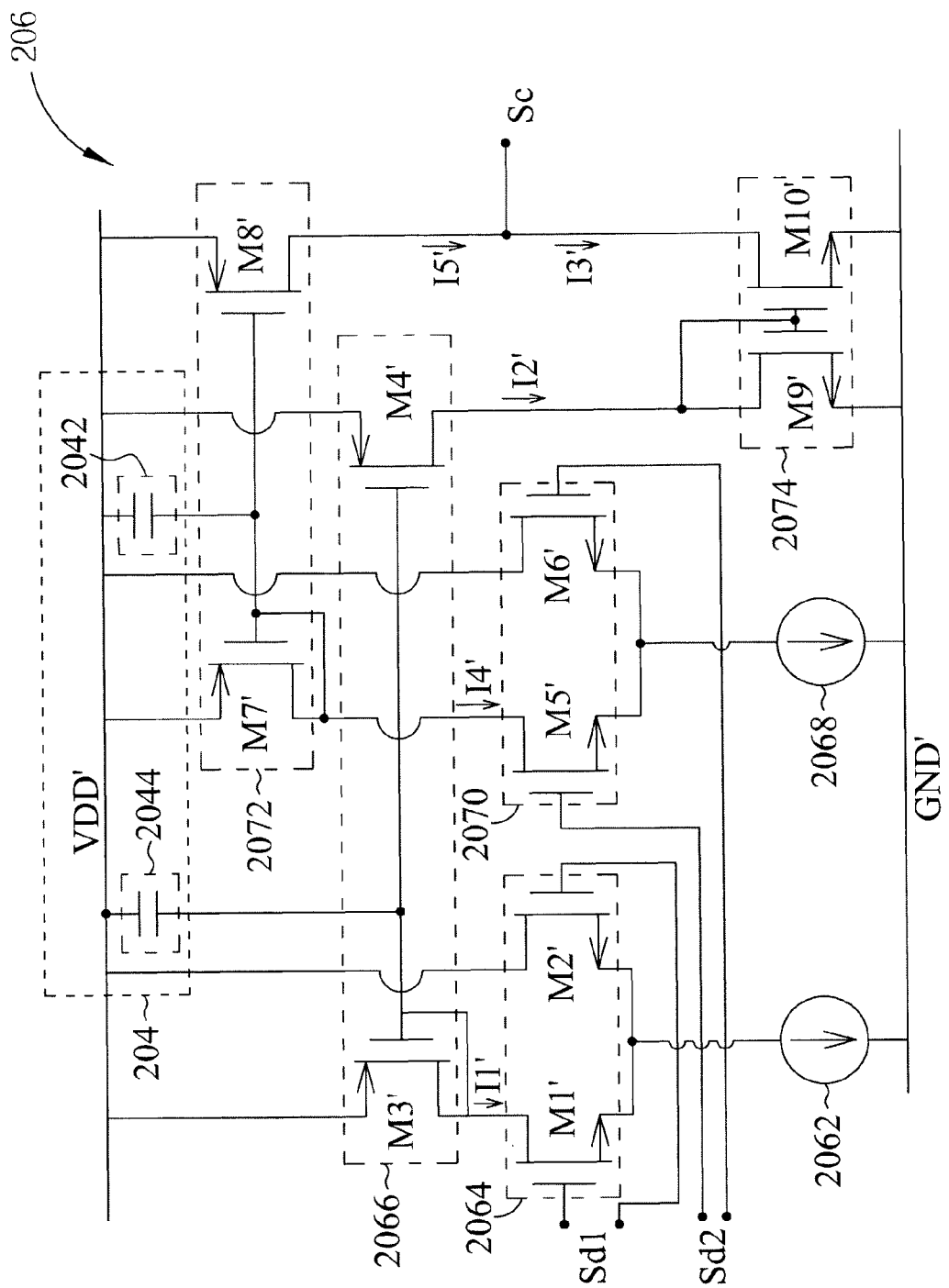
FIG. 4 depicts a circuit diagram of the charge pump of the clock generating circuit according to another embodiment of the present invention.

In another embodiment, the first filtering device 104 of the clock generating circuit 100 is integrated within the charge pump 106, thus, the charge pump 106 directly receives the first phase signal Sd1 and the second phase signal Sd2. FIG. 4 depicts the circuit diagram of the charge pump 206 of the clock generating circuit according to another embodiment. In other words, in the present embodiment, the charge pump 206 comprises a first filtering device 204, which is used for filtering an intermediary signal between the detection result (Sd1, Sd2) and the control signal Sc. In addition, the charge pump 206 comprises a first current source 2062, a first transconductor 2064, a first current mirror 2066, a second current source 2068, a second transconductor 2070, a second current mirror 2072 and a third current mirror 2074. The first transconductor 2064 comprises two N-type transistors M1' and M2', wherein the N-type transistors M1' and M2' form a differential pair transconductor. The first current mirror 2066 comprises a diode-connected P-type transistor M3' and a P-type transistor M4'. The second transconductor 2070 comprises two N-type transistor M5' and M6', wherein the N-type transistors M5', M6' form another differential pair transconductor. The second mirror 2072 comprises a diode-connected P-type transistor M7' and a P-type transistor M8'. The third current mirror 2074 comprises a diode-connected N-type transistor M9' and a N-type transistor M10'.

Furthermore, the first current source 2062 has a first end coupled to a first supply source GND, and a second end coupled to sources of the N-type transistors M1' and M2'. A drain of the P-type transistor M3' is coupled to a drain of the N-type transistor M1'. A source of the P-type transistor M3' is coupled to a second supply voltage VDD'. A gate of the P-type transistor M3' is coupled to a gate of the P-type transistor M4'. A source of the P-type transistor M4' is coupled to the second supply voltage VDD'. Similarly, the first end of the second current source 2068 is coupled to the first supply voltage GND', and the second end of the second current source 2068 is coupled to sources of N-type transistors M5' and M6'. A drain of the P-type transistor M7' is coupled to a drain of the N-type transistor M5'. A source of the P-type transistor M8' is coupled to the second supply voltage VDD. A gate of the P-type transistor M7' is coupled to a gate of the P-type transistor M8'. Gates of the N-type transistors M1' and M2' are coupled to the phase detector 102 for receiving the second phase signal Sd2 to transconduct the second phase signal Sd2 to a first current I1'. The first current mirror 2066 mirrors the first current I1' to a second current I2'. Then, the third current mirror 2074 mirrors the second current I2' to a third current I3'. In a similar fashion, gates of the N-type transistors M5' and M6' are coupled to the phase detector 102 for receiving the first phase signal Sd1 to transconduct the first phase signal Sd1 to a fourth current I4'. The second current mirror 2072 mirrors the fourth current I4' to a fifth current I5'. In the present embodiment, the third current I3' and the fifth current I5' generated by the charge pump 106 form the control signal Sc and to be transmitted to the second filtering device 108. In addition, the first filter 2042 of the first filtering device 204 is coupled to the node between the gates of the P-type transistors MT and M8', and the second filter 2044 of the first filtering device 104 is coupled to the node between the gates of the P-type transistors M3' and M4'. Note that the first filter 2042 is used for filtering a first voltage signal (i.e., the signal at the gates of the P-type transistors M7' and M8') of the signal path between the first phase signal Sd1 and the control signal Sc. The second filter 2044 is used for filtering a second voltage signal (i.e., the signal at the gates of the P-type transistors M3' and M4') of the signal path between the second phase signal Sd2 and the control signal Sc. In the present embodiment, both the first filter 2042 and second filter 2044 are realized by using a capacitive component, however that configuration is not critical and, as such, should not limit the scope of present invention. In other words, filters having a single pole are also to be considered to be within the scope of the present invention.

When the phase detector 102 outputs the first phase signal Sd1, the second transconductor 2070 transconducts the first phase signal Sd1 to the fourth current I4'. Since the first filter 2042 is coupled between the gate of P-type transistor M7' and the second supply voltage VDD', the voltage at the gate of the P-type transistor MT does not change abruptly. The change of the voltage is similar to the change of the filtered first phase signal Sdf1 as illustrated in FIG. 2B, and thus, the fifth current I5' passing through the P-type transistor M8' has a similar pulse shape. Similarly, when the phase detector 102 outputs the second phase signal Sd2, the second filter 2044 has a similar effect to that of the control signal Sc.

Figure 5:
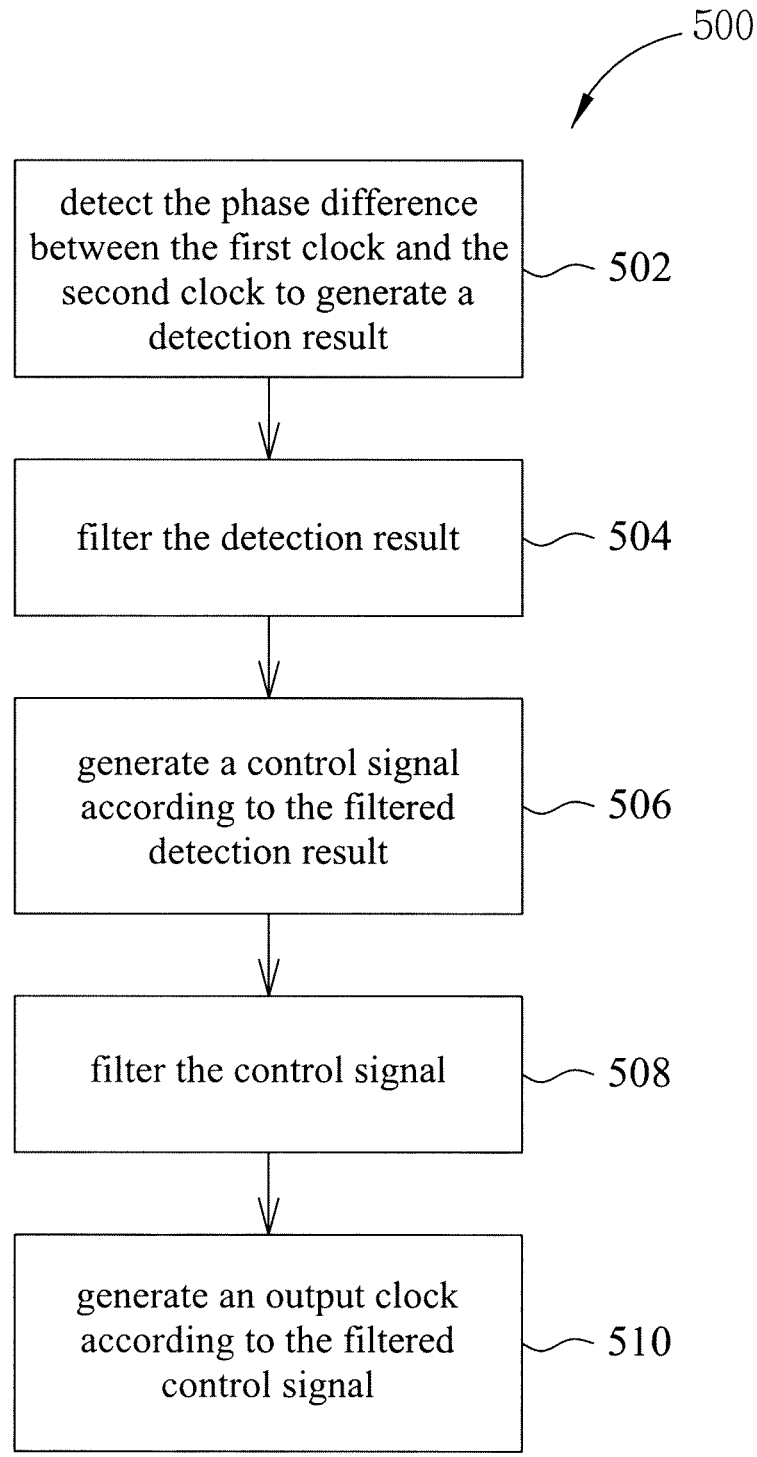
FIG. 5 depicts a flow chart of a clock generating method according to an embodiment of the present invention.

FIG. 5 depicts a flow chart of a clock generating method according to an embodiment. The clock generating method 500 in the embodiment may be realized according to the clock generating circuit 100 in FIG. 2A, and the following operation techniques in regards to the clock generating method 500 are specified with respect to the clock generating circuit 100. However, the clock generating circuit 100 is used only as an example and shall not limit the clock generating method described herein. Furthermore, the steps in the flow chart need not be executed as the sequence shown in FIG. 5 nor be successive, provided that the same result is substantially achieved; that is to say, the steps in FIG. 5 can be interleaved with other steps. The clock generating method 500 comprises the following steps:

Step 502: Detecting the phase difference between the first clock S1 and the second clock S2 to generate a detection result (Sd1, Sd2);

Step 504: Filtering the detection result

Step 506: Generating the control signal Sc corresponding to the filtered detection results (Sdf1, Sdf2) by the charge pump 106;

Step 508: Filtering the control signal Sc; and

Step 510: Generating the output clock Sout according to the filtered control signal (Scf), and generating the second clock S2 by using the output clock Sout.

In step 502, the detection result comprises a first phase signal Sd1 and a second phase signal Sd2. In step 504, the filtering process for the detection result comprises filtering the first clock signal Sd1 by the first filter 1042 and filtering the second phase signal Sd2 by the second filter 1044, wherein the charge pump 106 generates the control signal Sc according to the filtered first phase signal Sdf1 and the filtered second phase signal Sdf2. In step 506, since the pulse shapes of the first filtered phase signal Sdf1 and the second filtered phase signal Sdf2 rise and fall slowly as illustrated in FIG. 2B, unlike the pulse shape of the traditional phase-locked loop circuit, and thus the control signal Sc also has the similar pulse shape. In step 508, the second filtering device 108 generates the filtered control signal Scf after filtering the control signal Sc, where the pulse shape of the filtered control signal Scf is illustrated in FIG. 2B. In comparison to the traditional phase-locked loop circuit, the shape of the filtered control signal Scf tends more toward a straight line, without ripples appearing in each period of the control signal Scon' of the traditional phase-locked loop circuit.

Figure 6:
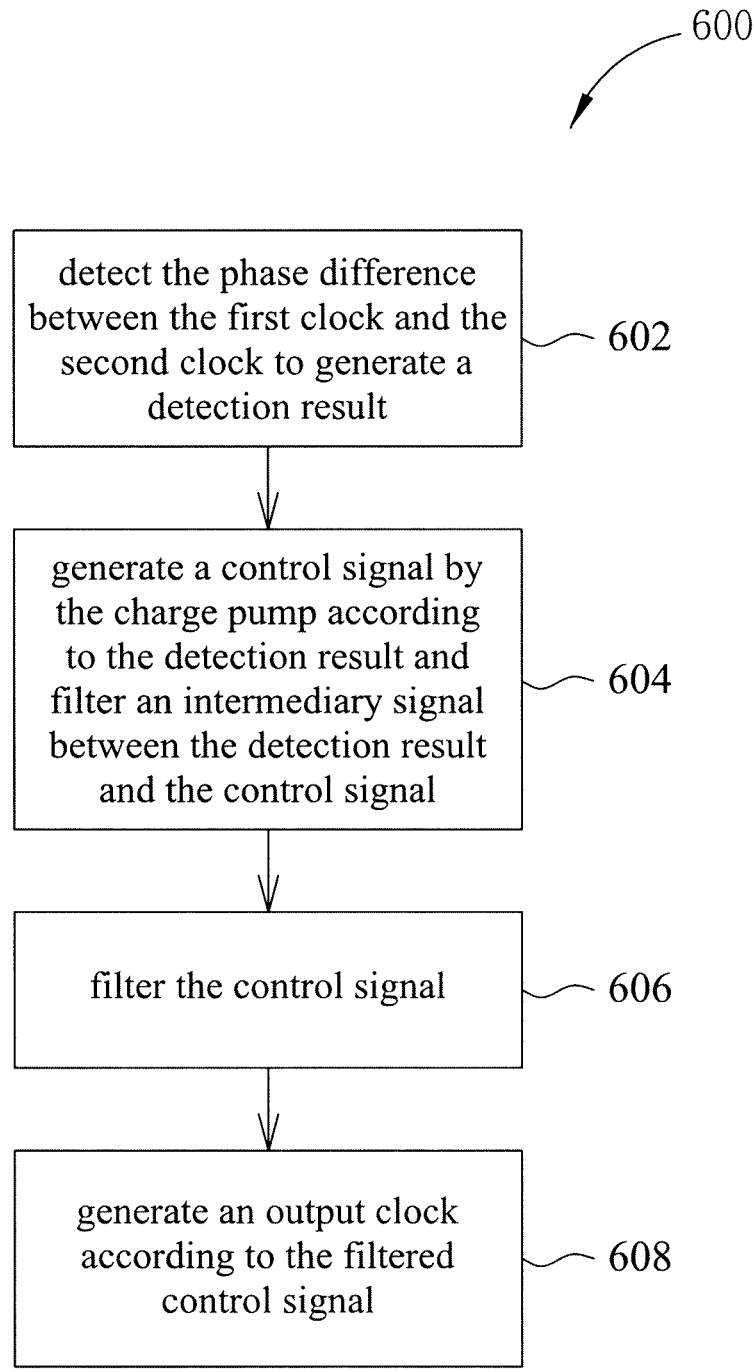
FIG. 6 depicts a flow chart of a clock generating method according to another embodiment of the present invention.

FIG. 6 depicts a flow chart of a clock generating method according to another embodiment of the present disclosure. The clock generating method 600 in the embodiment may be realized according to the clock generating circuit 100 depicted in FIG. 2A along with the charge pump 206 depicted in FIG. 4, and the following operation techniques in regards to the clock generating method 600 is specified with the clock generating circuit 100 and the charge pump 206. The clock generating method 600 comprises the following steps:

Step 602: Detecting the phase difference between the first clock S1 and the second clock S2 to generate a detection result (Sd1, Sd2);

Step 604: Generating the control signal Sc according to the detection result by utilizing the charge pump 206, and filtering an intermediary signal between the detection result and the control signal Sc;

Step 606: Filtering the control signal Sc; and

Step 608: Generating an output clock Sout according to the filtered control signal Scf, wherein the output clock Sout is used to generate the second clock S2.

In the clock generating method 600, the detection result also comprises a first phase signal Sd1 and a second phase signal Sd2, and Step 604 further comprises: filtering a first voltage signal between the first phase signal Sd1 and the control signal Sc by utilizing the first filter 2042; and filtering a second voltage signal between the second phase signal Sd2 and the control signal Sc by utilizing the second clock filter 2044.

In summary, in comparison to the traditional phase-locked loop circuit, the loop filter in the clock generating circuit 100 has lower manufacturing cost, and thus the filtered control signal Scf generated by the loop filter may tend towards a straight line, so no, or reduced, ripple signals appear in each period of the control signal Scon' as in the traditional phase-locked loop circuit. Consequently, the spur signals of the output clock Sout generated by the controllable oscillator 110 may be greatly improved. On the other hand, since a control signal Sc having a pulse wave format is not required in the present invention, and thus, it is not a requirement to have a high-speed charge pump 106 for generating the control signal Sc having the pulse wave format to further reduce the cost of the clock generating circuit 100.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A clock generating circuit comprising:
    a phase detector, for detecting a phase difference between a first clock and a second clock to generate a detection result associated with the phase difference;
    a charge pump, for generating a control signal according to the detection result, wherein the charge pump comprises a first filtering device for filtering an intermediary signal between the detection result and the control signal, wherein the first filtering device filters at least one gate node associated with a current mirror circuit comprising a pair of switching elements, and the first filtering device is disposed between a power supply and the at least one gate node;
    a second filtering device, for filtering the control signal; and
    a controllable oscillator for generating an output clock according to the filtered control signal, wherein the output clock is utilized to generate the second clock.

2. The clock generating circuit according to claim 1, wherein the detection result comprises a first phase signal and a second phase signal, and the first filtering device comprises:
    a first filter, for filtering a first voltage signal between the first phase signal and the control signal; and
    a second filter, for filtering a second voltage signal between the second phase signal and the control signal.

3. The clock generating circuit according to claim 2, wherein at least one of the first and second filters comprises a capacitive component.

4. A clock generating method comprising:
    detecting a phase difference between a first clock and a second clock to generate a detection result associated with the phase difference;
    generating a control signal by a charge pump according to the detection result and filtering an intermediary signal between the detection result and the control signal, wherein the filtering comprises filtering at least one gate node associated with a current mirror circuit comprising a pair of switching elements, and wherein the first filtering device is disposed between a power supply and the at least one gate node; and
    generating an output clock according to the control signal, wherein the output clock is utilized to generate the second clock.

5. The clock generating method according to claim 4, wherein the detection result comprises a first phase signal and a second phase signal, and the step of filtering the intermediary signal between the detection result and the control signal comprises:
    filtering a first voltage signal between the first phase signal and the detection result by a first filter; and
    filtering a second voltage signal between the second phase signal and the control signal by a second filter.

6. The clock generating method according to claim 5, wherein the first and second filters are both single pole low-pass filters.

* * * * *